US011342917B2

(12) United States Patent
Ueta et al.

(10) Patent No.: US 11,342,917 B2
(45) Date of Patent: May 24, 2022

(54) ELECTRONIC CONTROL DEVICE AND CIRCUIT RECONFIGURATION METHOD

(71) Applicant: HITACHI AUTOMOTIVE SYSTEMS, LTD., Ibaraki (JP)

(72) Inventors: Taisuke Ueta, Tokyo (JP); Kenichi Shimbo, Tokyo (JP); Tadanobu Toba, Tokyo (JP); Hideyuki Sakamoto, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 344 days.

(21) Appl. No.: 16/641,140

(22) PCT Filed: Jun. 27, 2018

(86) PCT No.: PCT/JP2018/024340
§ 371 (c)(1),
(2) Date: Feb. 21, 2020

(87) PCT Pub. No.: WO2019/044141
PCT Pub. Date: Mar. 7, 2019

(65) Prior Publication Data
US 2020/0177185 A1 Jun. 4, 2020

(30) Foreign Application Priority Data
Aug. 28, 2017 (JP) .............................. JP2017-163368

(51) Int. Cl.
*H03K 19/177* (2020.01)
*G06F 15/177* (2006.01)
(Continued)

(52) U.S. Cl.
CPC ......... *H03K 19/177* (2013.01); *G05D 1/0061* (2013.01); *G06F 1/02* (2013.01); *G06F 1/24* (2013.01); *G06F 15/177* (2013.01)

(58) Field of Classification Search
CPC ........................... G06F 15/177; H03K 19/177
See application file for complete search history.

(56) References Cited

U.S. PATENT DOCUMENTS

| 2007/0143577 | A1* | 6/2007 | Smith | ................. | G06F 15/7867 712/10 |
| 2017/0117892 | A1* | 4/2017 | Toichi | ................ | H03K 19/0008 |
| 2020/0114905 | A1* | 4/2020 | Ueta | ................ | H03K 19/17744 |

FOREIGN PATENT DOCUMENTS

| JP | 2001-320271 A | 11/2001 |
| JP | 2011-013829 A | 1/2011 |

(Continued)

OTHER PUBLICATIONS

International Search Report and English Translation, PCT/JP2018/024340 dated Jul. 31, 2018, 2 pgs.

*Primary Examiner* — Chuong D Ngo
(74) *Attorney, Agent, or Firm* — Volpe Koenig

(57) ABSTRACT

An electronic control device includes: a logic circuit for reconfiguring a plurality of arithmetic circuits including a first circuit and a second circuit; a reconfiguration controller that reconfigures the arithmetic circuits and checks the reconfigured arithmetic circuits based on reconfiguration commands; and a process controller that transmits the reconfiguration commands to the reconfiguration controller and instructs the arithmetic unit to execute operations, in which when a first reconfiguration command is received, the reconfiguration controller reconfigures and checks the first circuit, when the check of the first circuit by the reconfiguration controller is completed, the process controller instructs the first circuit to execute an operation, the process controller transmits a second reconfiguration command to the reconfiguration controller and instructs the reconfiguration controller to start to reconfigure the second circuit until the execution of a predetermined process of the first circuit is (Continued)

completed after completion of the reconfiguration of the first circuit.

10 Claims, 15 Drawing Sheets

(51) Int. Cl.
*G05D 1/00* (2006.01)
*G06F 1/02* (2006.01)
*G06F 1/24* (2006.01)

(56) References Cited

FOREIGN PATENT DOCUMENTS

| JP | 2017-107489 A | 6/2017 |
| JP | 2017-118450 A | 6/2017 |

* cited by examiner

[FIG. 1]
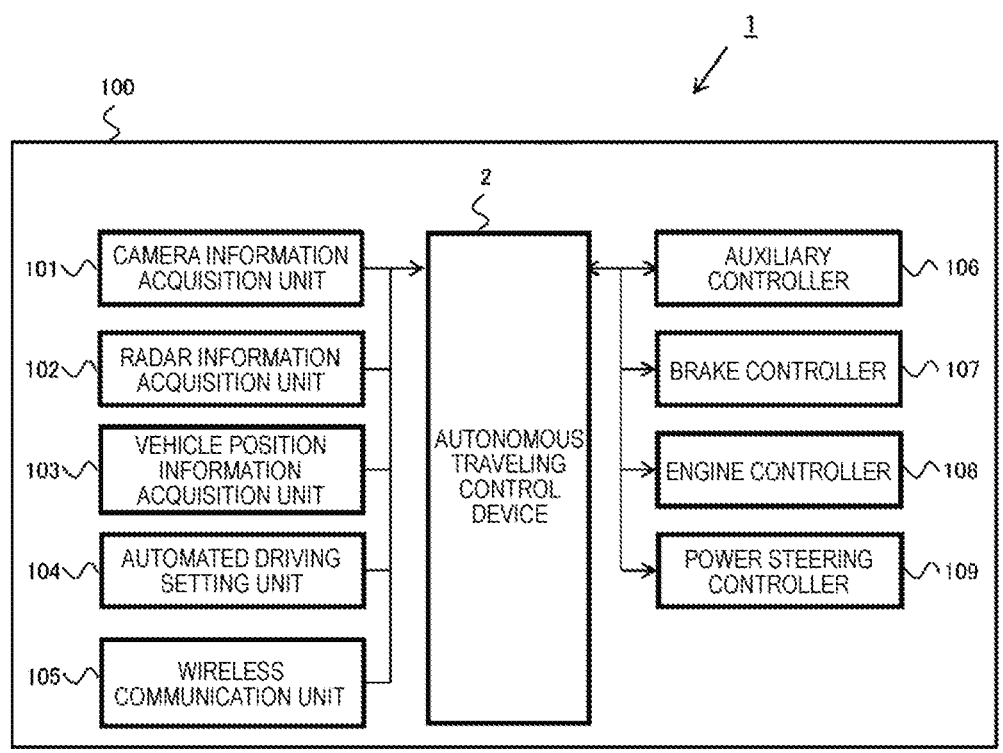

[FIG. 2]
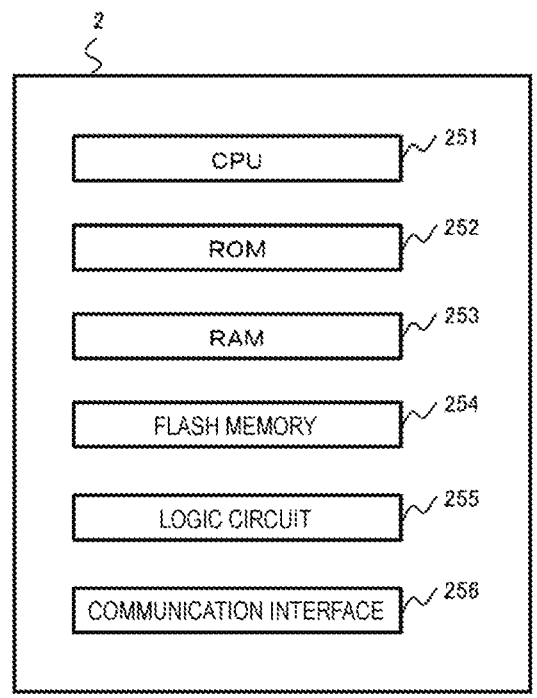

[FIG. 3]
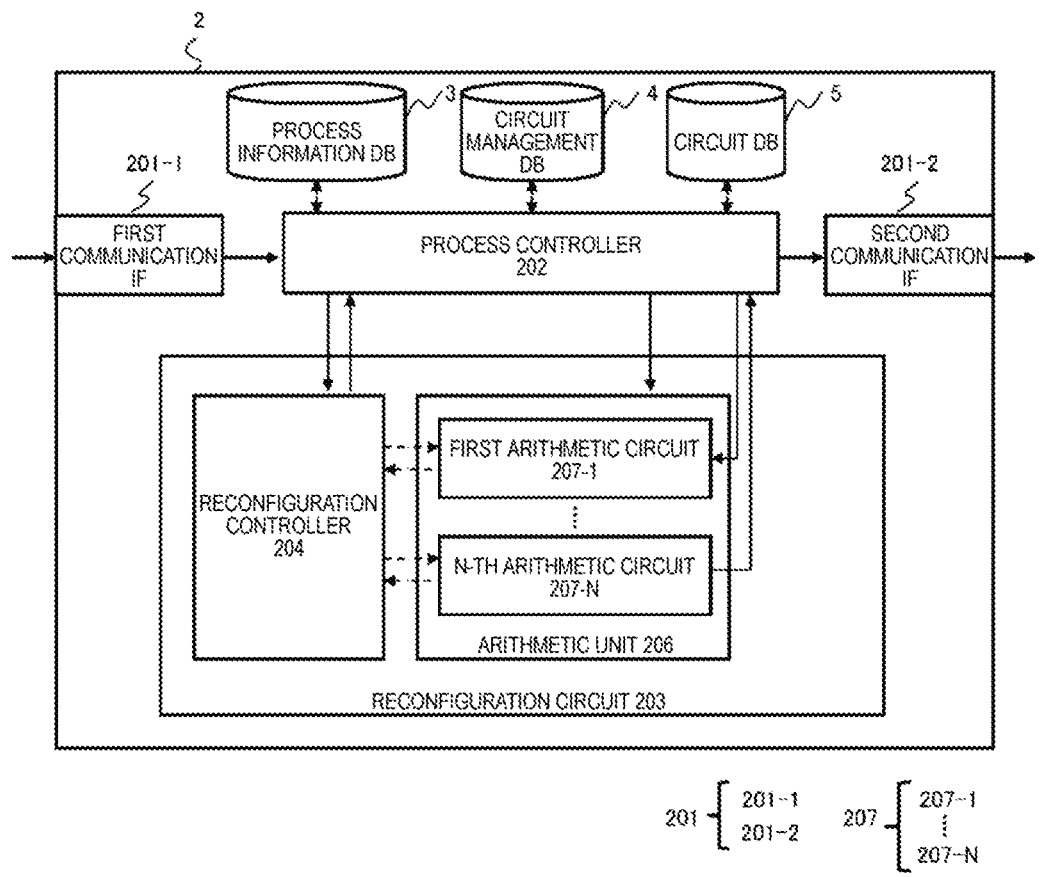

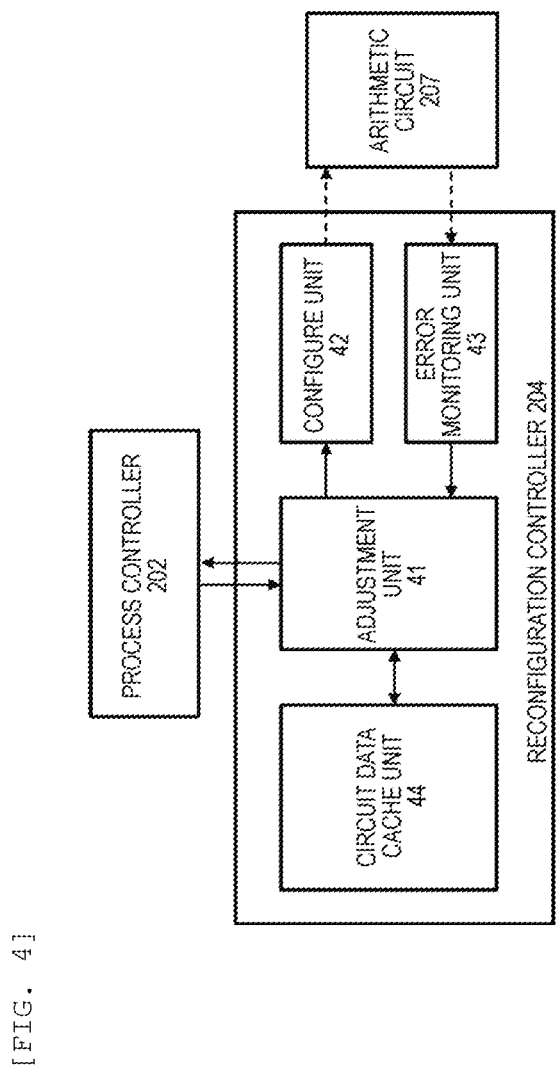
[FIG. 4]

[FIG. 5]
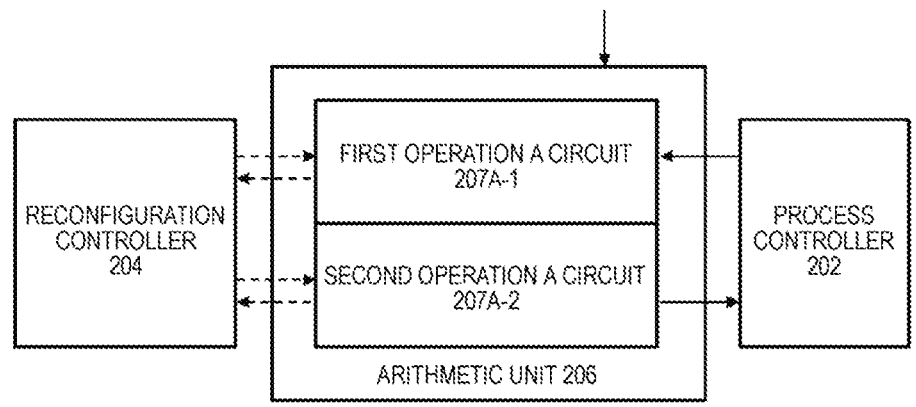
(a)
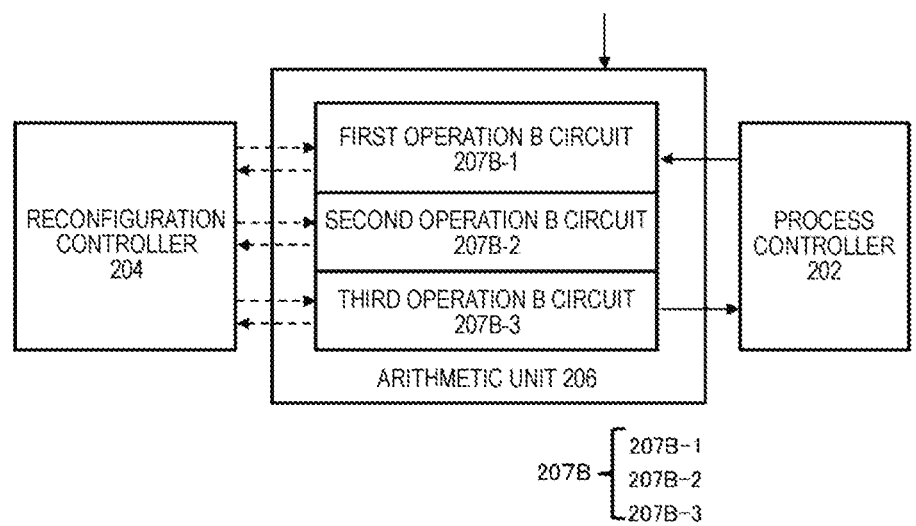
(b)

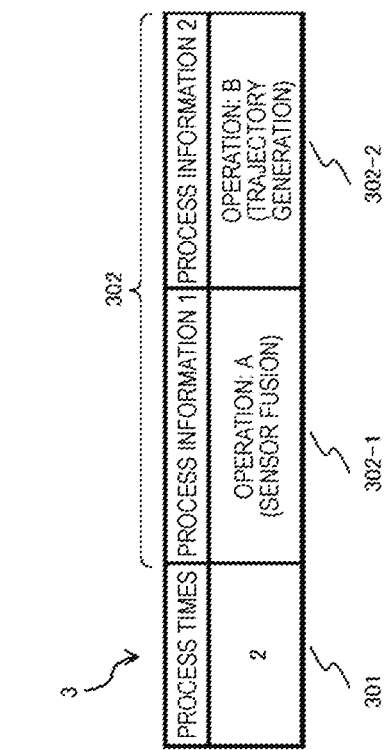

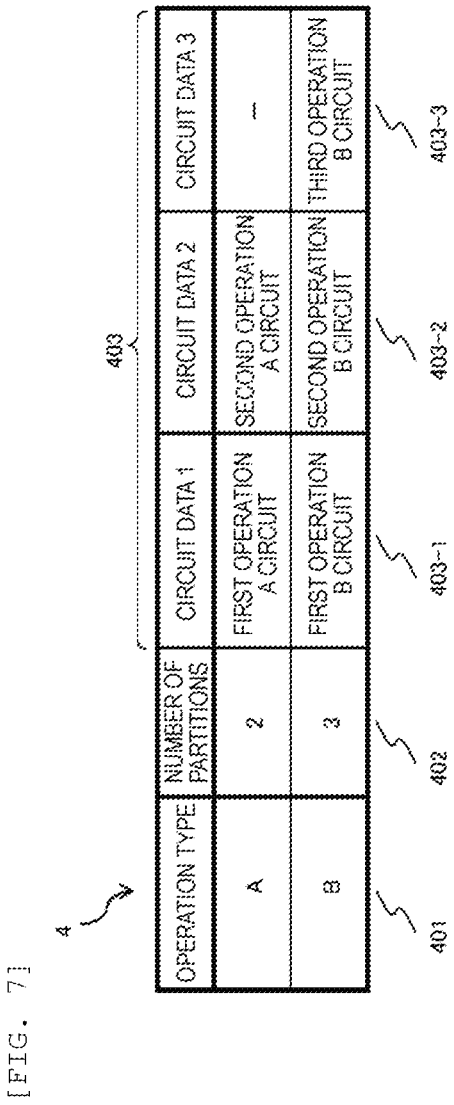
[FIG. 7]

[FIG. 8]
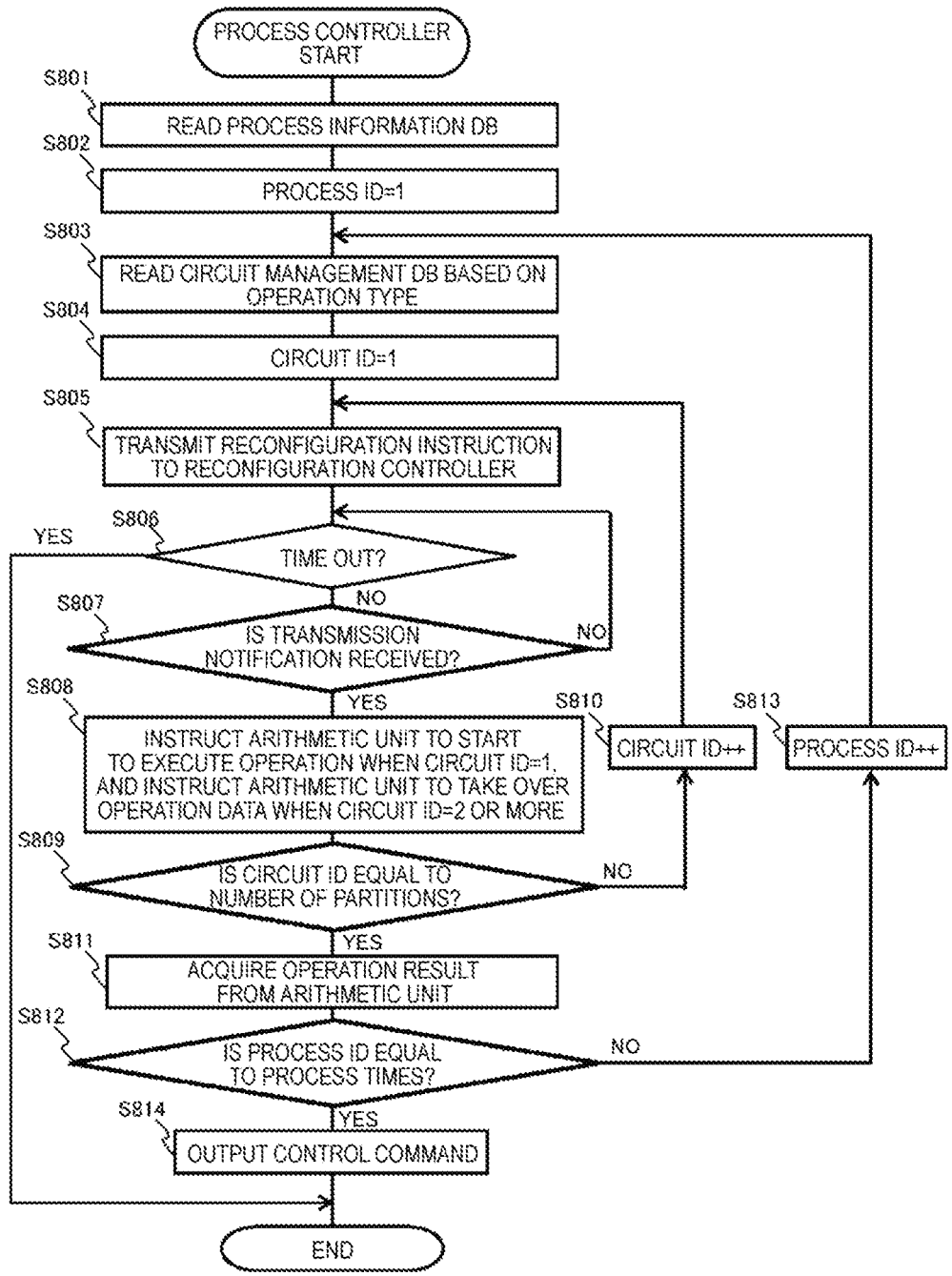

[FIG. 9]
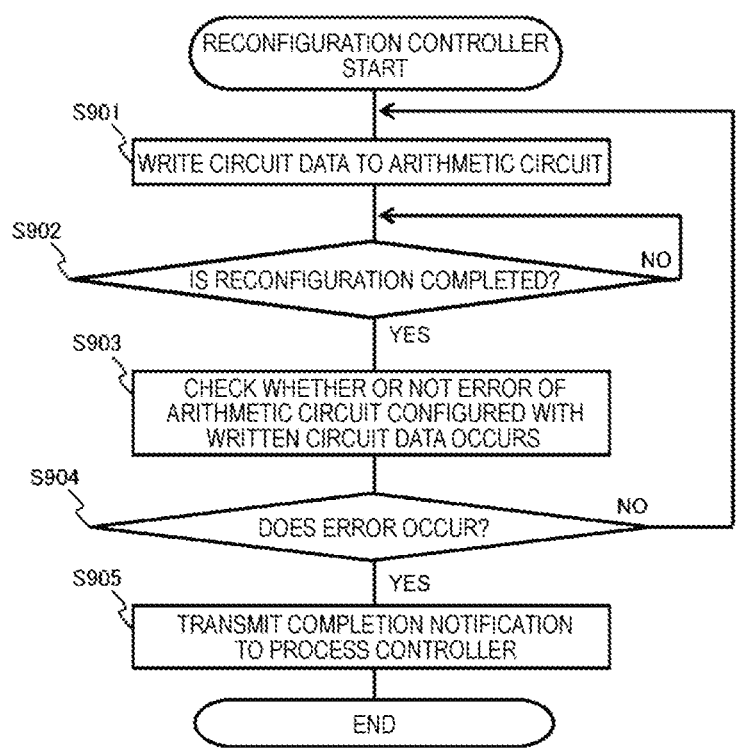

[FIG. 10]
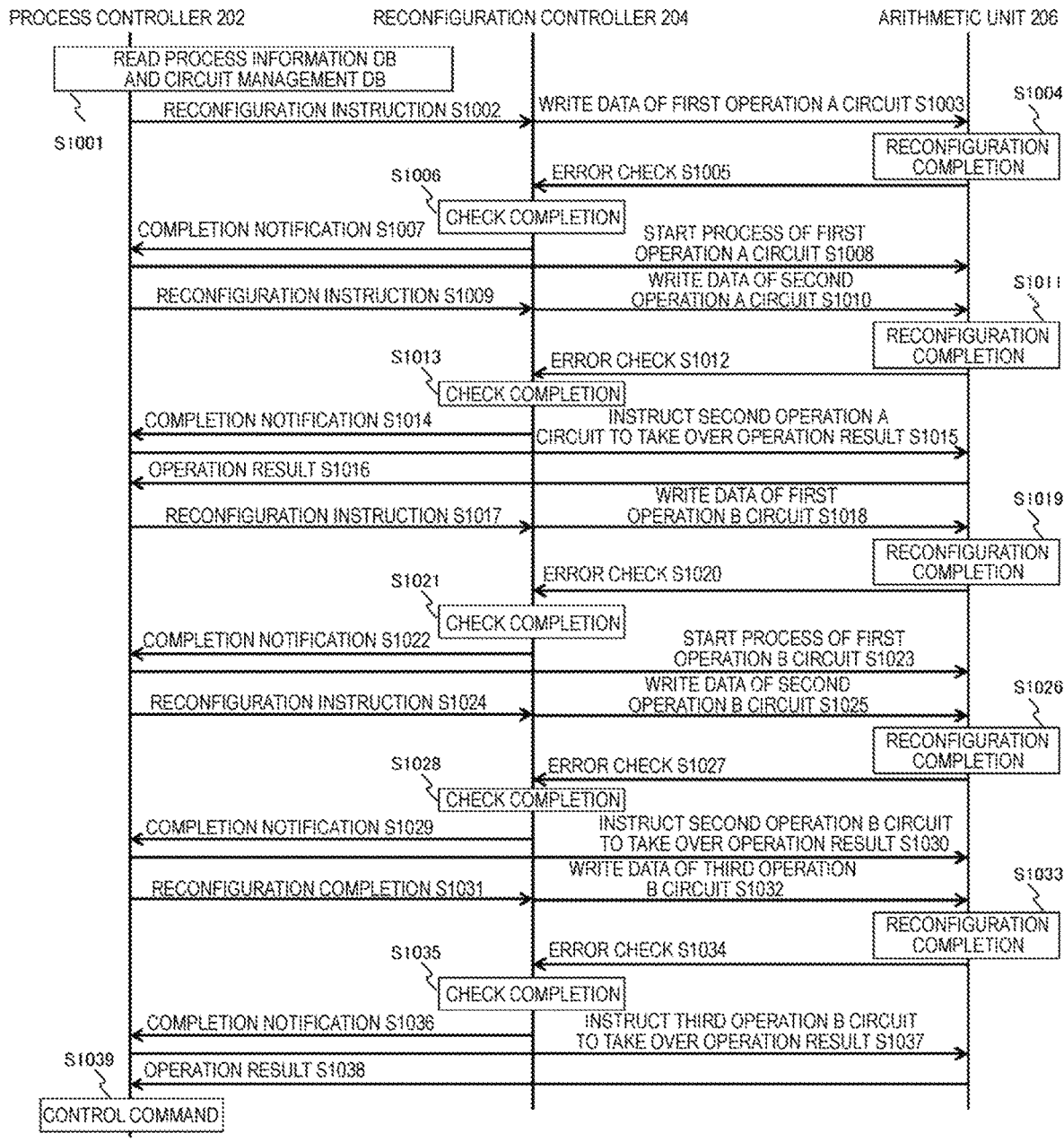

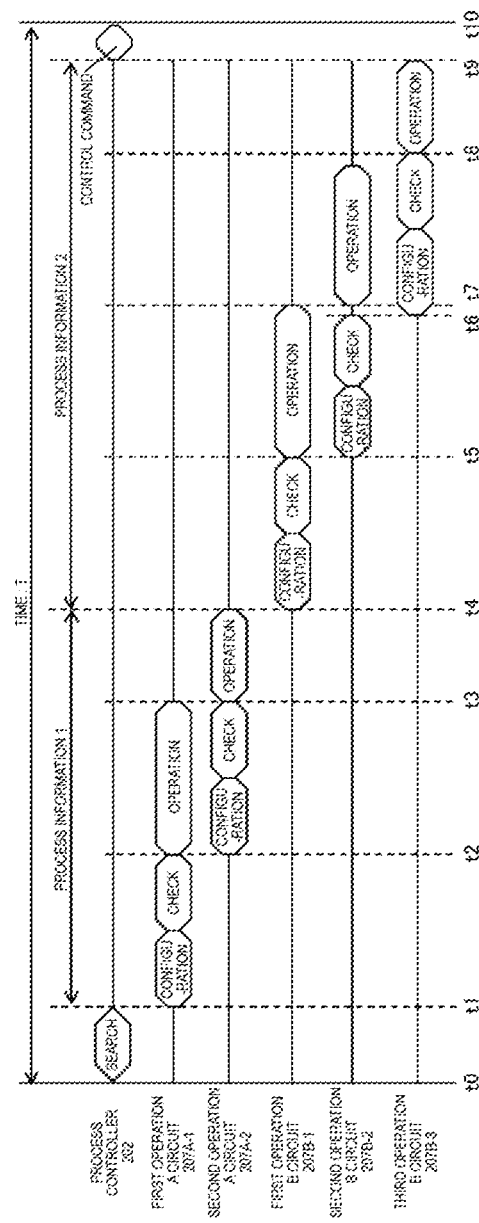
[FIG. 11]

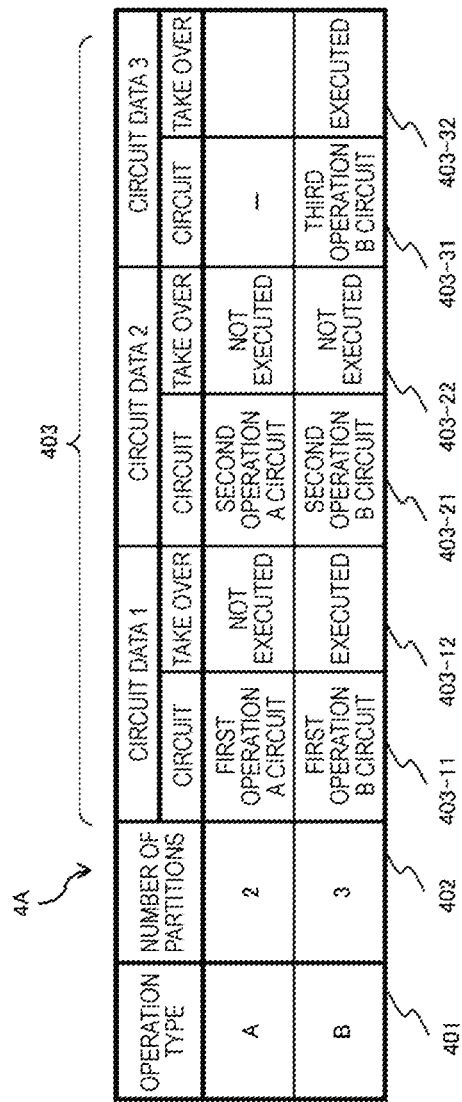
[FIG. 12]

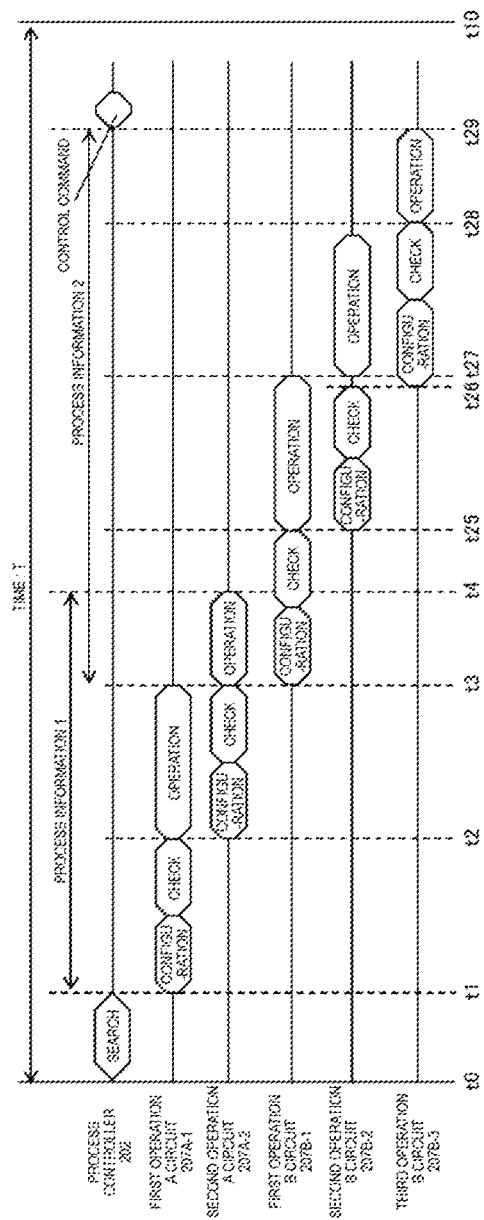
[FIG. 13]

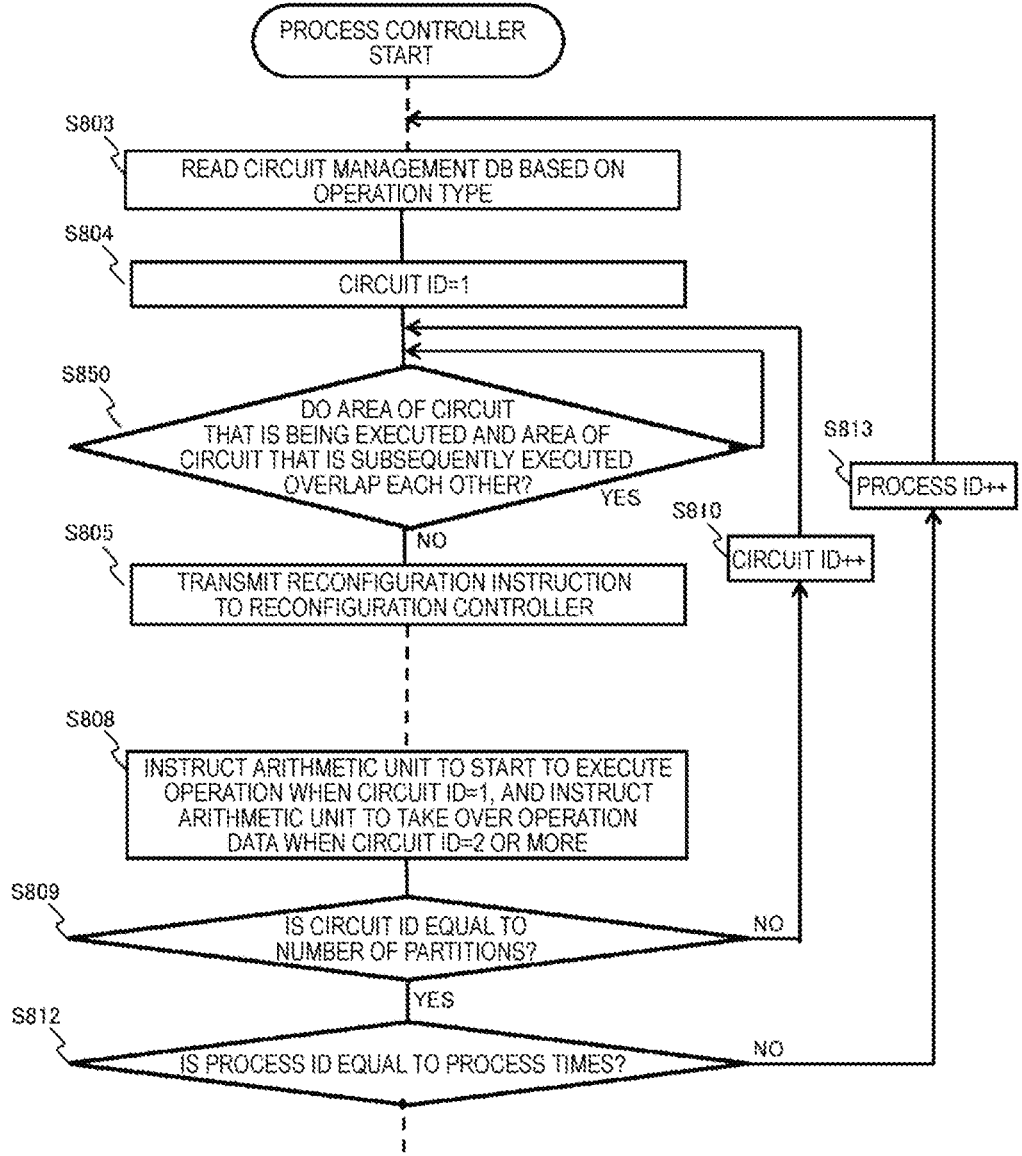
[FIG. 14]

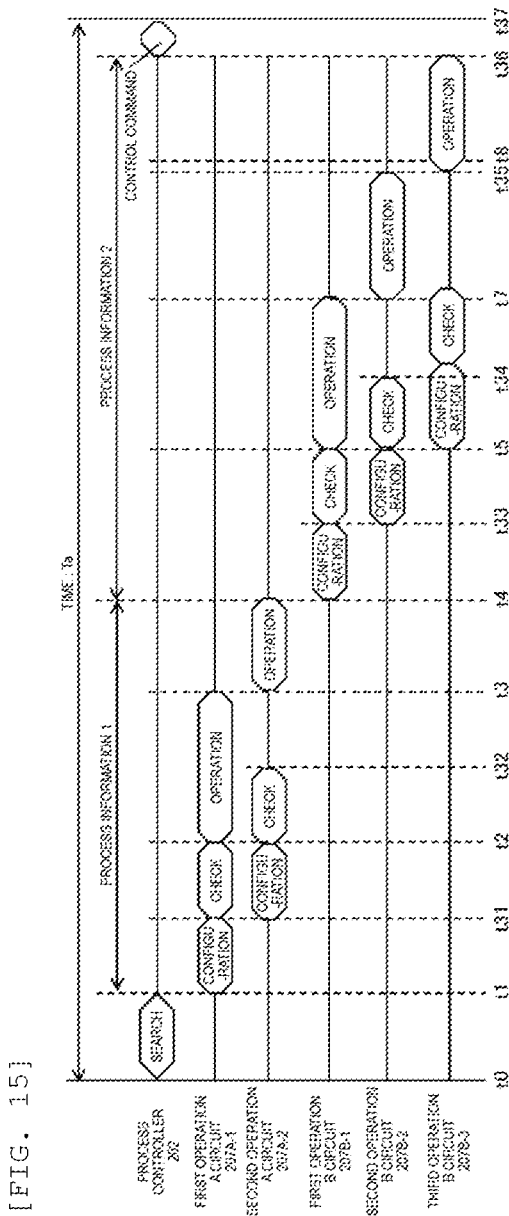
[FIG. 15]

ELECTRONIC CONTROL DEVICE AND CIRCUIT RECONFIGURATION METHOD

TECHNICAL FIELD

The present invention relates to an electronic control device and a circuit reconfiguration method.

BACKGROUND ART

The development of a technique aiming to automate driving of a vehicle has progressed. During automated driving, it is necessary to perform environmental recognition and vehicle control instead of a driver, and massive information processing is necessary. In order to deal with processing of an increased amount of information, the use of not only a CPU but also a hardware chip has been considered. In particular, it is expected to implement a plurality of processes in one logic circuit using a programmable logic device (PLD) such as a field programmable gate array (FPGA) in which a logic circuit is reconfigurable. When a logic circuit is used, an appropriate process in consideration of software errors is required. PTL 1 discloses a technique in which, when a soft error occurs, the occurrence of the error is detected for each of partitioned blocks and circuit setting information is rewritten in units of the partitioned blocks.

CITATION LIST

Patent Literature

PTL 1: JP-A-2011-13829

SUMMARY OF INVENTION

Technical Problem

It is desired to reduce the processing time in a reconfigurable logic circuit.

Solution to Problem

According to a first aspect of the present invention, there is provided an electronic control device including: a logic circuit capable of reconfiguring a plurality of arithmetic circuits including a first circuit and a second circuit; a reconfiguration controller that reconfigures the arithmetic circuits and checks the reconfigured arithmetic circuits based on reconfiguration commands; and a process controller that transmits the reconfiguration commands to the reconfiguration controller and instructs the arithmetic circuits to execute operations, in which when a first reconfiguration command is received, the reconfiguration controller reconfigures and checks the first circuit, when the check of the first circuit by the reconfiguration controller is completed, the process controller instructs the first circuit to execute an operation, the process controller transmits a second reconfiguration command to the reconfiguration controller and instructs the reconfiguration controller to start to reconfigure the second circuit until the operation of the first circuit is completed after completion of the reconfiguration of the first circuit.

According to a second aspect of the present invention, there is provided a circuit reconfiguration method that is executed in a logic circuit in which a plurality of arithmetic circuits including a first circuit and a second circuit are reconfigurable, the circuit reconfiguration method including: reconfiguring and checking the first circuit; instructing the first circuit to execute an operation after the check of the first circuit is completed; and starting to reconfigure the second circuit until the operation of the first circuit is completed after completion of the reconfiguration of the first circuit.

Advantageous Effects of Invention

According to the present invention, the processing time of a reconfigurable logic circuit can be reduced.

BRIEF DESCRIPTION OF DRAWINGS

FIG. 1 is a diagram illustrating a system configuration of an in-vehicle system 1.

FIG. 2 is a diagram illustrating a hardware configuration of an autonomous traveling control device 2.

FIG. 3 is a diagram illustrating a functional configuration of the autonomous traveling control device 2.

FIG. 4 is a diagram illustrating a functional configuration of a reconfiguration controller 204.

FIG. 5(a) is a diagram illustrating a configuration of an arithmetic unit 206 that executes a process of an operation type "A". FIG. 5(b) is a diagram illustrating a configuration of the arithmetic unit 206 that executes a process of an operation type "B".

FIG. 6 is a diagram illustrating an example of a process information database 3.

FIG. 7 is a diagram illustrating an example of a circuit management database 4.

FIG. 8 is a flowchart illustrating an operation of the process controller 202.

FIG. 9 is a flowchart illustrating an operation of the reconfiguration controller 204.

FIG. 10 is a sequence diagram illustrating an operation of the autonomous traveling control device 2.

FIG. 11 is a timing chart illustrating the operation of the autonomous traveling control device 2 according to the first embodiment.

FIG. 12 is a diagram illustrating an example of a circuit management DB 4A according to Modification Example 1.

FIG. 13 is a timing chart illustrating an operation of the autonomous traveling control device 2 according to Modification Example 2.

FIG. 14 is a flowchart illustrating an operation of the process controller 202 according to Modification Example 2.

FIG. 15 is a timing chart illustrating an operation of the autonomous traveling control device 2 according to a second embodiment.

DESCRIPTION OF EMBODIMENTS

First Embodiment

Hereinafter, a first embodiment of an autonomous traveling control device that is an electronic control device will be described with reference to FIGS. 1 to 11.

System Configuration

FIG. 1 is a diagram illustrating a system configuration of an in-vehicle system 1 including an autonomous traveling control device 2. The in-vehicle system 1 includes: a camera information acquisition unit 101 that is mounted on a vehicle 100 and recognizes external conditions of the vehicle 100 using a camera; a radar information acquisition unit 102 that recognizes the external conditions of the vehicle 100 using a radar; a vehicle position information acquisition unit 103 that detects a position of the vehicle 100 using a receiver of a satellite navigation system, for example, a GPS. The in-vehicle system 1 further includes: an automated driving setting unit 104 for setting automated driving of the vehicle 100; and a wireless communication unit 105 for updating information of the in-vehicle system 1 using over-the-air (OTA).

The in-vehicle system 1 further includes an autonomous traveling control device 2, an auxiliary controller 106, a brake controller 107, an engine controller 108, and a power steering controller 109. The autonomous traveling control device 2, the auxiliary controller 106, the brake controller 107, the engine controller 108, and the power steering controller 109 are, for example, electronic control units (ECUs).

The camera information acquisition unit 101, the radar information acquisition unit 102, the vehicle position information acquisition unit 103, the automated driving setting unit 104, the wireless communication unit 105, the autonomous traveling control device 2, the auxiliary controller 106, the brake controller 107, the engine controller 108, and the power steering controller 109 are communicably connected to each other via a controller area network (CAN). Each of the camera information acquisition unit 101, the radar information acquisition unit 102, and the vehicle position information acquisition unit 103 transmits information received from a sensor to the autonomous traveling control device 2. The automated driving setting unit 104 transmits setting information such as a destination, a route, or a traveling speed during automated driving to the autonomous traveling control device 2. Apart of information that is transmitted from the automated driving setting unit 104 may be received from an external device such as a server device 110 via the wireless communication unit 105.

The autonomous traveling control device 2 executes a process for automated driving control and outputs a control command to the brake controller 107, the engine controller 108, and the power steering controller 109 based on the process result. The auxiliary controller 106 executes the same control as that of the autonomous traveling control device 2 as an auxiliary controller. The brake controller 107 controls a braking force of the vehicle 100. The engine controller 108 controls a driving force of the vehicle 100. The power steering controller 109 controls steering of the vehicle 100.

When a setting request of automated driving is received from the automated driving setting unit 104, the autonomous traveling control device 2 calculates a trajectory along which the vehicle 100 moves based on external information received from the camera information acquisition unit 101, the radar information acquisition unit 102, the vehicle position information acquisition unit 103, and the like. The autonomous traveling control device 2 outputs control commands for a braking force, a driving force, steering, and the like to the brake controller 107, the engine controller 108, and the power steering controller 109 such that the vehicle 100 moves along the calculated trajectory. The brake controller 107, the engine controller 108, and the power steering controller 109 receive the control commands from the autonomous traveling control device 2 and output operation signals to actuators (not illustrated) as targets to be controlled, respectively.

Hardware Configuration of Autonomous Traveling Control Device

FIG. 2 is diagram illustrating a hardware configuration of the autonomous traveling control device 2. The autonomous traveling control device 2 includes a CPU 251, a ROM 252, a RAM 253, a flash memory 254, a logic circuit 255, and a communication interface 256. The CPU 251 implements a function described below by loading a program stored in the ROM 252 to a RAM 253 and executing the loaded program. The flash memory 254 is a non-volatile storage area. The CPU 251 may be a processor including a plurality of cores adopting a lockstep type.

The logic circuit 255 is a logic circuit that is reconfigurable using a PLD such as a FPGA. The logic circuit 255 is a logic circuit a part of which is reconfigurable, that is, a partially reconfigurable logic circuit. The communication interface 256 is an interface that executes communication using a predetermined protocol such as CAN. The autonomous traveling control device 2 is connected to another device via the communication interface 256 and transmits and receives data. The communication interface 256 may include two communication ports connected to an external device, or may include only one communication port.

Functional Configuration of Autonomous Traveling Control Device

FIG. 3 is a diagram illustrating a functional configuration of the autonomous traveling control device 2. The autonomous traveling control device 2 includes a first communication interface 201-1, a second communication interface 201-2, a process controller 202, a reconfiguration circuit 203, a reconfiguration controller 204, an arithmetic unit 206, a first arithmetic circuit 207-1 to an N-th arithmetic circuit 207-N (N represents any natural number of 2 or more), a process information database (hereinafter, referred to as "process information DB") 3, a circuit management database (hereinafter, referred to as "circuit management DB") 4, and a circuit database (hereinafter, referred to as "circuit DB") 5. Hereinafter, the first communication interface 201-1 and the second communication interface 201-2 will be collectively referred to as "communication interface 201". In addition, the first arithmetic circuit 207-1 to the N-th arithmetic circuit 207-N will be collectively referred to as "arithmetic circuit 207". The communication interface 201 is implemented with the communication interface 256 in FIG. 2. The process information DB 3, the circuit management DB 4, and the circuit DB 5 are implemented with the RAM 253 or the flash memory 254.

The reconfiguration circuit 203 is implemented with the logic circuit 255. The reconfiguration controller 204 and the arithmetic unit 206 are configured with the reconfiguration circuit 203. The arithmetic circuit 207 is a logic circuit that is configured with the arithmetic unit 206. In the embodiment, in the reconfiguration circuit 203, the reconfiguration controller 204 is not reconfigured, and only the calculating unit 206 is reconfigured. In other words, the reconfiguration circuit 203 is partially reconfigurable and instructs the arithmetic unit 206 to reconfigure the arithmetic circuit 207 while maintaining the circuit such as the reconfiguration controller 204.

The autonomous traveling control device 2 is connected to the camera information acquisition unit 101, the radar information acquisition unit 102, the vehicle position information acquisition unit 103, the automated driving setting unit 104, and the wireless communication unit 105 illustrated in FIG. 1 via the first communication interface 201-1 and is connected to the auxiliary controller 106, the brake controller 107, the engine controller 108, and the power steering controller 109 via the second communication interface 201-2. In FIG. 3, the autonomous traveling control device 2 includes the logical two communication interfaces including the first communication interface 201-1 and the second communication interface 201-2. However, the autonomous traveling control device 2 may include one logical communication interface having both the functions.

The process controller 202 is implemented with a program that is executed by the CPU 251. The process controller 202 repeatedly executes a process described below during a predetermined process period T. The process controller 202 periodically collects sensor information received from the camera information acquisition unit 101, the radar information acquisition unit 102, and the vehicle position information acquisition unit 103 and automated driving setting information received from the automated driving setting unit 104. The process controller 202 determines process times and process information with reference to the process information DB 3, the process times being the number of times the process is executed on the collected sensor information or the automated driving setting information.

The process controller 202 determines an operation type that is executed by the arithmetic unit 206 based on the process times and the process information determined by the process information DB 3. In addition, the process controller 202 determines the number of circuits configuring the arithmetic unit 206 and specific circuit data based on the determined operation type with reference to the circuit management DB 4. The circuit data is stored in the circuit DB 5. The circuit data is written to a circuit area inside the reconfiguration circuit 203, configures the logic circuit 255 such as the arithmetic circuit 207, and forms the arithmetic unit 206 or the like.

The process controller 202 transmits a reconfiguration instruction including the circuit data to the reconfiguration controller 204 and instructs the reconfiguration controller 204 to reconfigure the logic circuit 255 of the arithmetic unit 206. At this time, the reconfiguration controller 204 executes an error check process of the logic circuit 255 described below after the reconfiguration of the logic circuit 255. The process controller 202 sequentially executes reconfiguration from the first arithmetic circuit 207-1 based on the determined number of circuits configuring the arithmetic unit 206 and the determined circuit data.

The process controller 202 manages the reconfiguration state of the circuit area of the arithmetic unit 206 and adjusts a reconfiguration timing of each of the first arithmetic circuit 207-1 to the N-th arithmetic circuit 207-N. The process controller 202 outputs a control command for a braking force, a driving force, or the like from the second communication interface 201-2 based on the operation result acquired from the N-th arithmetic circuit 207-N as the finally reconfigured arithmetic circuit.

The reconfiguration controller 204 receives the reconfiguration instruction including the circuit data from the process controller 202 and changes the circuit configuration of the arithmetic unit 206 of the circuit area inside the reconfiguration circuit 203. That is, the reconfiguration controller 204 reconfigures the arithmetic circuit 207. After the reconfiguration of the arithmetic circuit 207 is completed, the reconfiguration controller 204 executes an error check of the configured arithmetic circuit 207. After the error check is completed, the reconfiguration controller 204 notifies a completion notification to the process controller 202. The details of the functional configuration of the reconfiguration controller 204 will be described below with reference to FIG. 4. The error check of the configured arithmetic circuit 207 by the reconfiguration controller 204 will also be referred to as "soft error check" or "check".

Algorithm of Logic Circuit

As described above, when a new operation is executed in the reconfiguration circuit 203, the arithmetic circuit is reconfigured first, and then an error check of the reconfigured arithmetic circuit is executed. Through these steps, the operation can be executed in the reconfigured arithmetic circuit. Therefore, the time required for the reconfiguration and the error check of the arithmetic circuit will also be referred to as the time required for the preparation for executing the operation in the arithmetic circuit. In the embodiment, the time required for the preparation is covered up by overlapping the time for which another arithmetic circuit executes an operation. The details will be described below.

Functional Configuration of Reconfiguration Controller

FIG. 4 is a diagram illustrating a functional configuration of the reconfiguration controller 204. The reconfiguration controller 204 includes an adjustment unit 41, a configure unit 42, an error monitoring unit 43, and a circuit data cache unit 44.

The adjustment unit 41 is a functional unit that transmits and receives data to and from the process controller 202. After the reconfiguration instruction including the circuit data is received from the process controller 202, the adjustment unit 41 transmits the circuit data to the configure unit 42 in order to instruct the arithmetic unit 206 to configure the arithmetic circuit 207. The adjustment unit 41 adjusts a timing at which the configure unit 42 configures the arithmetic circuit 207 and a timing at which the error monitoring unit 43 executes the error check. After the configure unit 42 configures the arithmetic circuit 207, the adjustment unit 41 instructs the error monitoring unit 43 to execute the error check of the arithmetic circuit 207. After the error check by the error monitoring unit 43 is completed, the adjustment unit 41 notifies a completion notification to the process controller 202.

The configure unit 42 configures the arithmetic circuit 207 using the circuit data received from the adjustment unit 41. In FIG. 4, a connection between the configure unit 42 and the arithmetic circuit 207 is indicated by a dotted line. The dotted line indicates an interface or the like with a configuration memory of the logic circuit 255. Specifically, by writing the circuit data to the configuration memory, the configure unit 42 configures the arithmetic circuit 207 inside the arithmetic unit 206 on the logic circuit 255.

The error monitoring unit 43 is a functional unit an error check for checking whether or not a soft error of the logic circuit 255 occurs. The error monitoring unit 43 transmits the error check result to the adjustment unit 41. Specifically, the error monitoring unit 43 reads a configuration memory of a portion corresponding to the arithmetic circuit 207 and determines whether or not an error occurs using an error correction function. The logic circuit 255 according to the embodiment cannot execute the reconfiguration and the error check of the arithmetic circuit simultaneously. That is, when the configure unit 42 operates, the error monitoring unit 43 cannot operate. When the error monitoring unit 43 does not operate, the configure unit 42 cannot operate.

The circuit data cache unit 44 is a functional unit that temporarily stores the circuit data that is received by the adjustment unit 41 from the process controller 202. After the error monitoring unit 43 detects the error, the adjustment unit 41 may transmit the circuit data to the configure unit 42 again using the circuit data that is temporarily stored in the circuit data cache unit 44.

Configuration Example of Arithmetic Circuit in Arithmetic Unit

FIG. 5 is a diagram illustrating a configuration example of the arithmetic circuit 207 in the arithmetic unit 206. FIG. 5(a) is a diagram illustrating a configuration of the arithmetic unit 206 that executes a process of an operation type "A". FIG. 5(b) is a diagram illustrating a configuration of the arithmetic unit 206 that executes a process of an operation type "B". The arithmetic unit 206 that executes the process of the operation type "A" includes a first operation A circuit 207A-1 that executes a first process of the operation A and a second operation A circuit 207A-2 that executes a second process of the operation A. The arithmetic unit 206 that executes the process of the operation type "B" includes a first operation B circuit 207B-1 that executes a first process of the operation B, a second operation B circuit 207B-2 that executes a second process of the operation B, and a third operation B circuit 207B-3 that executes a third process of the operation B. Hereinafter, the first operation A circuit 207A-1 and the second operation A circuit 207A-2 will be collectively referred to as "operation A circuit 207A". In addition, the first operation B circuit 207B-1, the second operation B circuit 207B-2, and the third operation B circuit 207B-3 will be collectively referred to as "operation B circuit 207B".

Each of the first operation A circuit 207A-1 and the second operation A circuit 207A-2 is connected to the reconfiguration controller 204 via the interface or the like with the configuration memory. The operation A circuit 207A is connected to the process controller 202, the first operation A circuit 207A-1 receives an execution start instruction of the process of the operation A from the process controller 202, and the second operation A circuit 207A-2 notifies the process result of the operation A to the process controller 202. In addition, the operation A circuit 207A receives information from the process controller 202, the information relating to a timing at which the operation process switches from the first operation A circuit 207A-1 to the second operation A circuit 207A-2 or is maintained.

Each of the first operation B circuit 207B-1, the second operation B circuit 207B-2, and the third operation B circuit 207B-3 is connected to the reconfiguration controller 204 via the interface or the like with the configuration memory. The operation B circuit 207B is connected to the process controller 202, the first operation B circuit 207B-1 receives an execution start instruction of the process of the operation B from the process controller 202, and the third operation B circuit 207B-3 notifies the process result of the operation B to the process controller 202. In addition, the operation B circuit 207B receives information from the process controller 202, the information relating to a timing at which the operation process switches from the first operation B circuit 207B-1 to the second operation B circuit 207B-2 or is maintained and a timing at which the operation process switches from the second operation B circuit 207B-2 to the third operation B circuit 207B-3 or is maintained.

Management Information of Process Information Database

FIG. 6 is a diagram illustrating an example of a process information DB 3. The process information DB 3 is a database that is referred to by the process controller 202 and stores the collected sensor information and the details of the process that is executed on the automated driving setting information. The process information DB 3 includes fields of a process times 301 and a process information 302. The process times 301 stores the number of times the arithmetic unit 206 executes an operation. The process information 302 includes a plurality of process information, for example, process information 1 and process information 2 and stores information regarding the name of the process that is executed by the arithmetic unit 206, for example, the operation A or the operation B. The operation A and the operation B may store information regarding a specific operation process relating to autonomous traveling control. For example, the operation A may store information regarding sensor fusion, and the operation B may store information regarding trajectory generation.

In the field illustrated in FIG. 6, "2" is stored in the field of the process times 301. Therefore, the number of times the arithmetic unit 206 executes the operation is two. The process information 1 represented by reference numeral 302-1 shows that the operation A is executed as the first process of the arithmetic unit 206. The process information 2 represented by reference numeral 302-2 shows that the operation B is executed as the second process of the arithmetic unit 206. The process information DB 3 illustrated in FIG. 6 is exemplary, and the number of pieces of process information configuring the process information 302 is not necessarily 2. That is, the process information 302 may include three or more pieces of process information.

In the embodiment, in each of the operation processes, a predetermined operation is executed using the execution result of the previous operation process. For example, in the operation A, the result of executing the operation based on the collected sensor information and the automated driving setting information is acquired. In the operation B, a predetermined process is executed based on the execution result of the operation A. However, in the operation B, the operation may be executed using information other than the execution result of the operation A.

Management Information of Circuit Management Database

FIG. 7 is a diagram illustrating an example of the circuit management DB 4. The circuit management DB 4 is a database that is referred to by the process controller 202 and stores information regarding the number of partitions in the arithmetic circuit per operation type and the partitioned circuit data. The circuit management DB 4 includes fields of a number of partitions 402 and a circuit data 403 per operation type 401. The operation type 401 stores information regarding the operation type corresponding to the process information 302 acquired by the process controller 202 referring to the process information DB 3. The number of partitions 402 stores the number by which the arithmetic circuit 207 configuring the arithmetic unit 206 is partitioned depending on the operation type 401. The circuit data 403 stores information regarding the circuit data that is partitioned into a plurality of sections depending on the operation type 401. Specifically, the information is address information for acquiring corresponding circuit data from the circuit data stored in the circuit DB 5.

In an example illustrated in FIG. 7, in a row where the field of the operation type 401 stores "A", the field of the number of partitions 402 stores "2", which shows that the number by which the operation A circuit 207A configuring the arithmetic unit 206 that executes the operation A is partitioned is two. The circuit data 1 represented by reference numeral 403-1 shows the information of the first operation A circuit (207A-1) of the operation A circuit 207A. The circuit data 2 represented by reference numeral 403-2 shows the information of the second operation A circuit (207A-2) of the operation A circuit 207A. The circuit data 3 represented by reference numeral 403-3 does not show information because it is not used.

In addition, in a row where the field of the operation type 401 stores "B", the field of the number of partitions 402 stores "3", which shows that the number by which the operation B circuit 207A configuring the arithmetic unit 206 that executes the operation B is partitioned is three. The circuit data 1 represented by reference numeral 403-1 shows the information of the first operation B circuit (207B-1) of the operation B circuit 207B. The circuit data 2 represented by reference numeral 403-2 shows the information of the second operation B circuit (207B-2) of the operation B circuit 207B. The circuit data 3 represented by reference numeral 403-3 shows the information of the third operation B circuit (207B-3) of the operation B circuit 207B. The circuit management DB 4 illustrated in FIG. 7 is exemplary, and the number of pieces of circuit data configuring the circuit data 403 is not necessary three. The number of types stored as the operation type 401 is not necessarily two.

Flowchart of Process Controller

FIG. 8 is a flowchart illustrating an operation of the process controller 202. The process controller 202 executes the operation illustrated in the following flowchart per predetermined process period T.

In Step S801, the process controller 202 acquires the information including the process times 301 and the process information 302 with reference to the process information DB 3. Next, in Step S802, the process controller 202 assigns "1" to a process ID that is a loop counter. In Step S803, the process controller 202 acquires the operation type based on the process ID and the process information 302 acquired in Step S801. The process controller 202 reads the circuit management DB 4 and acquires information regarding the number of partitions 402 and the circuit data 403 corresponding to the acquired operation type. When the process information DB 3 is as illustrated in FIG. 6 and the process ID is "1", "A" is acquired as the operation type. When the circuit management DB 4 is as illustrated in FIG. 7, it is determined that the number of partitions is "2". Next, in Step S804, the process controller 202 assigns "1" to a circuit ID that is a loop counter.

In Step S805, the process controller 202 transmits the reconfiguration instruction including the circuit data based on the description of the circuit management DB 4 to the reconfiguration controller 204. When the circuit management DB 4 is as illustrated in FIG. 7 and the circuit ID is "1", the process controller 202 transmits the circuit data of the first operation A circuit to the reconfiguration controller 204 with reference to the circuit data 1 represented by reference numeral 403-1. Although not illustrated in the flowchart, after the circuit data is received, the reconfiguration controller 204 immediately starts to reconfigure the arithmetic unit 206 and executes the error check. After the reconfiguration and the error check are completed, the reconfiguration controller 204 notifies the completion notification to the process controller 202.

Next, in Step S806, the process controller 202 determines whether or not the wait time of the completion notification is timeout, in other words, whether or not the reconfiguration and the error check of the arithmetic unit 206 are completed on time. When the process controller 202 determines that the wait time is timeout, the process controller 202 determines that the process cannot be executed within the predetermined process period T and ends the operation as an abnormal process. In addition, when the process controller 202 determines that the wait time is not timeout, in Step S807, the process controller 202 determines whether or not the completion notification is received. When the completion notification is received, the process controller 202 proceeds to Step S808. When the completion notification is not received, the process controller 202 proceeds to Step S806.

In Step S808, the process controller 202 executes the following process according to the value of the circuit ID. That is, when the circuit ID is "1", the reconfiguration of the first arithmetic circuit 207-1 has just been completed. Therefore, the process controller 202 instructs the arithmetic unit 206 to start to execute the operation. When the circuit ID is "2" or more, the process controller 202 instructs the arithmetic circuit that has just been reconfigured to take over the process result of the arithmetic circuit that has just been executed and instructs the arithmetic circuit to execute the operation. Therefore, the process controller 202 instructs the arithmetic unit 206 to take over the operation data. For example, the process controller 202 instructs the third operation B circuit 207B-3 that has just been reconfigured to take over the operation data of the second operation B circuit 207B-2 that has just been executed.

Next, in Step S809, the process controller 202 determines whether or not the circuit ID is equal to a defined value, that is, the value in the field of the number of partitions 402 of the circuit management DB 4. When the process controller 202 determines that the circuit ID is equal to the value in the field, the reconfiguration of all the circuit data corresponding to the operation type 401 shown in circuit management DB 4 is completed. Therefore, the process controller 202 proceeds Step S811 and acquires the operation result from the arithmetic unit 206. To be exact, the process controller 202 acquires the operation result after waiting for the completion of the operation of the N-th arithmetic circuit 207-N. When the process controller 202 determines that the circuit ID is not equal to the value in the field, the process controller 202 proceeds to Step S810, increments the circuit ID, and returns to Step S805.

In Step S812 that is executed after Step S811, the process controller 202 determines whether or not the process ID is equal to a defined value, that is, the value in the field of the process times 301 of the process information DB 3. When the process controller 202 determines that the process ID is equal to the value in the field, all the processes shown in the process information DB 3 are completed. Therefore, the process controller 202 proceeds to Step S814, outputs a control command as the final result, and ends the operation illustrated in FIG. 8. When the process controller 202 determines that the process ID is not equal to the value in the field, the process controller 202 proceeds to Step S813, increments the process ID, and returns to the Step S803.

Flowchart of Reconfiguration Controller

FIG. 9 is a flowchart illustrating an operation of the reconfiguration controller 204. The reconfiguration controller 204 operates by the cooperative operation of the adjustment unit 41, the configure unit 42, the error monitoring unit 43, and the circuit data cache unit 44 illustrated in FIG. 4.

As described above, the reconfiguration controller 204 executes the operation illustrated in the following flowchart whenever the process controller 204 receives the reconfiguration instruction including the circuit data from the process controller 202. The management and the adjustment of the operation time in Step S901 to Step S905 are executed by the adjustment unit 41.

In Step S901, the reconfiguration controller 204 writes the circuit data included in the received reconfiguration instruction to the arithmetic circuit 207. The reconfiguration controller 204 starts to reconfigure the arithmetic circuit 207 via the configure unit 42 waits for a given time until the completion of the reconfiguration in Step S902. When the reconfiguration controller 204 determines that the reconfiguration is completed in Step S902, the reconfiguration controller 204 proceeds to Step S903. In Step S903, the reconfiguration controller 204 checks whether or not the error of the arithmetic circuit 207 configured with the written circuit data occurs. In other words, the reconfiguration controller 204 reads the configuration memory of the portion corresponding to the arithmetic circuit 207 from the error monitoring unit 43 and checks whether or not the read configuration memory matches the written information.

Next, in Step S904, the reconfiguration controller 204 determines whether or not the error is detected in Step S903. When the reconfiguration controller 204 determines that the error does not occur, the reconfiguration controller 204 proceeds to Step S905. When the reconfiguration controller 204 determines that the error is detected, the reconfiguration controller 204 returns Step S901 and executes the reconfiguration again. When the reconfiguration controller 204 returns to Step S901 and writes the circuit data to the arithmetic circuit 207 again, the reconfiguration controller 204 writes the circuit data to the arithmetic circuit 207 again using the circuit data that is temporarily stored in the circuit data cache unit 44. In Step S905, the reconfiguration controller 204 notifies the completion of the reconfiguration and the error check to the process controller 202. After the above-described steps, the operation ends.

Operation Sequence

FIG. 10 is a sequence diagram illustrating an operation of the autonomous traveling control device 2. Specifically, FIG. 10 illustrates the process of the autonomous traveling control device 2 when the process information DB 3 illustrated in FIG. 6 and the circuit management DB 4 illustrated in FIG. 7 are used. FIG. 10 illustrates only one period of the time T. However, these processes are repeatedly executed. That is, S1001 on the upper left side of FIG. 10 to S1039 on the lower left side of FIG. 10 are the processes corresponding to one period.

First, the process controller 202 reads the process times 301 and the process information 302 from the process information DB 3 and reads the operation type 401, the number of partitions 402, and the circuit data 403 from the circuit management DB 4 (S1001). Next, in order to execute the operation A of the process information 1 represented by reference numeral 302-1, the process controller 202 notifies the reconfiguration instruction including the circuit data of the first operation A circuit that is designated by the circuit data 1 represented by reference numeral 403-1 to the reconfiguration controller 204 (S1002). The reconfiguration controller 204 writes the circuit data of the first operation A circuit to the arithmetic unit 206 (S1003). After the reconfiguration in the arithmetic unit 206 is completed (S1004), that is, the first operation A circuit 207A-1 is configured, the reconfiguration controller 204 executes the error check of the first operation A circuit 207A-1 (S1005). In S1005, the reconfiguration controller 204 reads the information written to the configuration memory of the arithmetic unit 206. Therefore, an arrow from the arithmetic unit 206 to the reconfiguration controller 204 is drawn. After the error check is completed (S1006), the reconfiguration controller 204 notifies the completion notification to the process controller 202 (S1007).

Next, the process controller 202 instructs the arithmetic unit 206 to start the process of the first operation A circuit 207A-1 (S1008), and notifies the reconfiguration instruction including the circuit data of the second operation A circuit that is designated by the circuit data 2 represented by reference numeral 403-2 to the reconfiguration controller 204 (S1009). The reconfiguration controller 204 writes the circuit data of the second operation A circuit to the arithmetic unit 206 (S1010). As a result, the execution of the operation in the first operation A circuit 207A-1 and the writing of the circuit data of the second operation A circuit are executed simultaneously. After the reconfiguration in the arithmetic unit 206 is completed (S1011), that is, the second operation A circuit 207A-2 is configured, the reconfiguration controller 204 executes the error check of the second operation A circuit 207A-2 (S1012). After the error check is completed (S1013), the reconfiguration controller 204 notifies the completion notification to the process controller 202 (S1014).

Next, the process controller 202 instructs the second operation A circuit 207A-2 of the arithmetic unit 206 to take over the operation result of the first operation A circuit 207A-1 and to start the process (S1015). Next, the arithmetic unit 206 transmits the operation result of the second operation A circuit 207A-2 to the process controller 202 (S1016).

Since the operation A designated by the process information 1 ends, the process controller 202 proceeds to the next process, that is, the operation B designated by the process information 2. Next, in order to execute the operation B of the process information 2 represented by reference numeral 302-2, the process controller 202 notifies the reconfiguration instruction including the circuit data of the first operation B circuit that is designated by the circuit data 1 represented by reference numeral 403-1 to the reconfiguration controller 204 (S1017). The reconfiguration controller 204 writes the circuit data of the first operation B circuit to the arithmetic unit 206 (S1018). After the reconfiguration in the arithmetic unit 206 is completed (S1019), that is, the first operation B circuit 207B-1 is configured, the reconfiguration controller 204 executes the error check of the first operation B circuit 207B-1 (S1020). After the error check is completed (S1021), the reconfiguration controller 204 notifies the completion notification to the process controller 202 (S1022).

Next, the process controller 202 instructs the arithmetic unit 206 to start the process of the first operation B circuit 207B-1 (S1023), and notifies the reconfiguration instruction including the circuit data of the second operation B circuit that is designated by the circuit data 2 represented by reference numeral 403-2 to the reconfiguration controller 204 (S1024). The reconfiguration controller 204 writes the circuit data of the second operation B circuit to the arithmetic unit 206 (S1025). As a result, the execution of the operation in the first operation B circuit 207B-1 and the writing of the circuit data of the second operation B circuit are executed simultaneously. After the reconfiguration in the arithmetic unit 206 is completed (S1026), that is, the second operation B circuit 207B-2 is configured, the reconfiguration controller 204 executes the error check of the second operation B circuit 207B-2 (S1027). After the error check is completed (S1028), the reconfiguration controller 204 notifies the completion notification to the process controller 202 (S1029).

Next, the process controller 202 instructs the second operation B circuit 207B-2 of the arithmetic unit 206 to take over the operation result of the first operation B circuit 207B-1 and to start the process (S1030). Concurrently, the process controller 202 notifies the reconfiguration instruction including the circuit data of the third operation B circuit that is designated by the circuit data 3 represented by reference numeral 403-3 to the reconfiguration controller 204 (S1031). The reconfiguration controller 204 writes the circuit data of the third operation B circuit to the arithmetic unit 206 (S1032). As a result, the execution of the operation in the second operation B circuit 207B-2 and the writing of the circuit data of the third operation B circuit are executed simultaneously. After the reconfiguration in the arithmetic unit 206 is completed (S1033), that is, the third operation B circuit 207B-3 is configured, the reconfiguration controller 204 executes the error check of the second operation B circuit 207B-3 (S1034). After the error check is completed (S1035), the reconfiguration controller 204 notifies the completion notification to the process controller 202 (S1036).

Next, the process controller 202 instructs the third operation B circuit 207B-3 of the arithmetic unit 206 to take over the operation result of the second operation B circuit 207B-2 and to start the process (S1037). Next, the arithmetic unit 206 transmits the operation result of the third operation B circuit 207B-3 to the process controller 202 (S1038). The process controller 202 ends the operation B designated by the process information 2 and ends all the processes. Therefore, the process controller 202 outputs a control command value (s1039) and ends the operation. Hereinabove, the transition diagram illustrated in FIG. 10 has been described.

Timing Chart

FIG. 11 is a timing chart illustrating an operation of the autonomous traveling control device 2. The timing chart illustrated in FIG. 11 corresponds to the operation of the autonomous traveling control device 2 illustrated in FIG. 10. In FIG. 11, the time increases from the left to the right. As illustrated in the left end in FIG. 11, FIG. 11 illustrates the operation of the process controller 202, the state of the first operation A circuit 207A-1, the state of the second operation A circuit 207A-2, the state of the first operation B circuit 207B-1, the state of the second operation B circuit 207B-2, and the state of the third operation B circuit 207B-3 in order from the top. However, due to the problem of a space in FIG. 11, the reconfiguration of the logic circuit is shown as "configuration", and the error check of the reconfigured logic circuit is shown as "check".

The process controller 202 starts the periodic process at time t0, reads the process times 301 and the process information 302 from the process information DB 3, and reads the operation type 401, the number of partitions 402, and the circuit data 403 from the circuit management DB 4. At time t1 when the reading is completed, the process controller 202 notifies the reconfiguration instruction including the circuit data of the first operation A circuit that is designated by the circuit data 1 represented by reference numeral 403-1 to the reconfiguration controller 204, and the reconfiguration of the first operation A circuit 207A-1 is started by the reconfiguration controller 204.

At time t2, after the reconfiguration and the error check of the first operation A circuit 207A-1 are completed, the process controller 202 executes the following two processes. That is, the process controller 202 instructs the first operation A circuit 207A-1 to start the process and notifies the reconfiguration instruction including the circuit data of the second operation A circuit that is designated by the circuit data 2 represented by reference numeral 403-2 to the reconfiguration controller 204. The reconfiguration of the second operation A circuit 207A-2 that receives the notification is started by the reconfiguration controller 204.

At time t3, the reconfiguration and the error check of the second operation A circuit 207A-2 are completed, and concurrently the operation process of the first operation A circuit 207A-1 is completed. At this time, the process controller 202 instructs the second operation A circuit 207a-2 to take over the operation result of the first operation A circuit 207A-1 and to start the process. At time t4, after the operation process of the second operation A circuit 207A-2 is completed, the process controller 202 notifies the reconfiguration instruction including the circuit data of the first operation B circuit that is designated by the circuit data 1 represented by reference numeral 403-1 to the reconfiguration controller 204. The reconfiguration of the first operation B circuit 207B-1 is started by the reconfiguration controller 204.

At time t5, after the reconfiguration and the error check of the first operation B circuit 207B-1 are completed, the process controller 202 instructs the first operation B circuit 207B-1 to start the process and executes the following process. That is, the process controller 202 notifies the reconfiguration instruction including the circuit data of the second operation B circuit that is designated by the circuit data 2 represented by reference numeral 403-2 to the reconfiguration controller 204. The reconfiguration of the second operation B circuit 207B-2 is started by the reconfiguration controller 204 in response to the notification.

At time t6, after the reconfiguration and the error check of the second operation B circuit 207B-2 are completed, the process controller 202 instructs the second operation B circuit 207B-2 to take over the operation result of the first operation B circuit 207B-1 and to start the process. However, the operation process of the first operation B circuit 207B-1 is not yet completed. Therefore, the operation process of the second operation B circuit 207B-2 using the operation process result of the first operation B circuit 207B-1 cannot be started. Further, the process controller 202 notifies the reconfiguration instruction including the circuit data of the third operation B circuit that is designated by the circuit data 3 represented by reference numeral 403-3 to the reconfiguration controller 204, and the reconfiguration of the third operation B circuit 207B-3 is started by the reconfiguration controller 204.

At time t7, after the operation process of the first operation B circuit 207B-1 is completed, the second operation B circuit 207B-2 takes over the operation result of the first operation B circuit 207B-1 and starts the process. This operation process is completed earlier than time t8. However, at this timing, the error check of the third operation B circuit 207B-3 is not yet completed. Therefore, the operation of the third operation B circuit 207B-3 cannot be started. At time t8, after the reconfiguration and the error check of the third operation B circuit 207B-3 are completed, the process controller 202 instructs the third operation B circuit 207B-3 to take over the operation result of the second operation B circuit 207B-2 and to start the process. At time t9, after the operation process of the third operation B circuit 207b-3 is completed, the process controller 202 outputs a control command based on the operation result. At time t10, after the output of the control command is completed, the process controller 202 ends the processes corresponding to one period of the time t.

According to the above-described first embodiment, the following effects can be obtained.

(1) The autonomous traveling control device 2 includes: the logic circuit 255 capable of reconfiguring a plurality of arithmetic circuits including the first operation A circuit 207A-1 and the second operation A circuit 207A-2; the reconfiguration controller 204 that reconfigures the arithmetic circuits and checks the reconfigured arithmetic circuits based on reconfiguration commands; and the process controller 202 that transmits the reconfiguration commands to the reconfiguration controller 204 and instructs the arithmetic unit to execute operations. When a first reconfiguration command is received, the reconfiguration controller 204 reconfigures and checks the first circuit (S901, S903 in FIG. 9). When the check of the first circuit by the reconfiguration controller 204 is completed, the process controller 202 instructs the first circuit to execute an operation (S807 in FIG. 8: Yes, S808). The process controller 202 transmits a second reconfiguration command to the reconfiguration controller 204 and instructs the reconfiguration controller 204 to start to reconfigure the second circuit until the execution of a predetermined process of the first circuit is completed after completion of the reconfiguration of the first circuit (S809: NO, S805).

The process controller 202 partitions and reconfigures the arithmetic circuits constituting the arithmetic unit 206 such that the time for which the arithmetic circuit execute the operation overlaps the time required for the preparation for executing the operation in the next arithmetic circuit. Therefore, the process controller 202 covers up the time required for the preparation for executing the operation in the arithmetic circuit, so-called, overhead such that the processing time required until all the operations by the logic circuit 255 are completed from the start of the reconfiguration of the logic circuit 255 can be reduced.

(2) The process controller 202 transmits the second reconfiguration command to the reconfiguration controller until the operation of the first circuit is completed after completion of the check of the first circuit (between time t2 to time t3 in FIG. 11). Therefore, the present invention is applicable to even a case where the logic circuit 255 according to the embodiment that cannot execute the reconfiguration and the error check of the arithmetic circuits simultaneously is used. Immediately after the check of the first circuit is completed, the operation of the first circuit starts. Therefore, it can also be said that the process controller 202 transmits the second reconfiguration command to the reconfiguration controller until the operation of the first circuit is completed after the start of the operation of the first circuit.

(3) The reconfiguration controller 204 checks the second circuit after completion of the reconfiguration of the second circuit. The process controller 202 instructs the second circuit to execute an operation using a result of the operation of the first circuit after the check of the second circuit and the operation of the first circuit are completed. Therefore, the operation can be executed using the previous operation result.

(4) The reconfiguration controller 204 restarts to reconfigure the arithmetic circuits when an error is detected during the check of the arithmetic circuits (S904 in FIG. 9: NO, S901). Therefore, the autonomous traveling control device 2 can execute the operation in a state where no error occurs in the reconfigured arithmetic circuits.

(5) The number and a scale of each of the arithmetic circuits reconfigured in the logic circuit 255 is determined based on an execution time of operation that is executed in the arithmetic circuit. Therefore, as illustrated in time t2 to time t3 in FIG. 11, the operation execution time of the first operation A circuit 207A-1 can be matched to the time of the reconfiguration and the error check that is the time required for the preparation for the execution of the second operation A circuit 207A-2.

(6) The autonomous traveling control device 2 further includes the circuit management DB 4 that stores information regarding the arithmetic circuits configured in the logic circuit 255. The process controller 202 outputs the reconfiguration command to the reconfiguration controller 204 based on the circuit management DB 4. Therefore, the process controller 202 reads the circuit management DB 4 that is generated in advance and can output the reconfiguration command to the reconfiguration controller 204.

(7) The reconfiguration controller 204 includes the configure unit 42 that reconfigures the arithmetic circuits and the error monitoring unit 43 that checks the reconfigured arithmetic circuits. The configure unit 42 starts to reconfigure the arithmetic circuits after receiving the reconfiguration commands from the process controller. After the reconfiguration by the configure unit 42 is completed, the error monitoring unit 43 starts to check the reconfigured arithmetic circuits and notifies a result of the check to the process controller 202.

Modification Example 1

In the above-described first embodiment, each of the second and subsequent arithmetic circuits that are executed in the arithmetic unit 206 uses the previous operation result at all times. However, each of the arithmetic circuits of the arithmetic unit 206 does not necessarily use the previous operation result. In this case, instead of the circuit management DB 4, a circuit management DB 4A including not only the each of the circuit data but also information regarding whether or not to use the previous operation result is used. The process controller 202 determines whether or not to instruct the arithmetic circuit to take over the operation data obtained by the operation that has just been executed with reference to the circuit management DB 4A in S808 of FIG. 8.

FIG. 12 is a diagram illustrating an example of the circuit management DB 4A according to Modification Example 1. In the circuit management DB 4A, the number of items of the circuit data 403 is more than that of the circuit management DB 4. Specifically, the circuit data 403 in the circuit management DB 4A stores the information of the circuit data that is partitioned into a plurality of pieces and whether or not to instruct the arithmetic circuit to take over the operation data depending on the operation type 401. Specifically, the circuit data 1 includes a circuit type 403-11 and whether or not to take over the operation data 403-12, the circuit data 2 includes a circuit type 403-21 and whether or not to take over the operation data 403-22, and the circuit data 3 includes a circuit type 403-31 and whether or not to take over the operation data 403-32.

The operation type A is the first process that is executed. Therefore, "Not Executed" is stored in whether or not to take over the operation data 403-12 in the circuit data 1. After the error check of the first operation A circuit is completed, the process controller 202 that reads the data instructs the first operation A circuit to execute the operation instantaneously. In addition, "Not Executed" is stored in whether or not to take over the operation data 403-22 in the circuit data 2 of the operation type A. After the error check of the second operation A circuit is completed, the process controller 202 that reads the data instructs the second operation A circuit to execute the operation instantaneously. In the operation type B, "Executed" is stored in whether or not to take over the operation data 403-12 in the circuit data 1. After the error check of the first operation B circuit is completed, the process controller 202 that reads the data instructs the first operation B circuit 207B-1 to take over the operation result of the operation type A that is previous operation, to be exact, the operation result of the second operation A circuit 207A-2 and to start the process.

In this configuration, when the arithmetic circuit does not use the operation result of the arithmetic circuit that has just been executed, the operation can be executed immediately after the check of the reconfigured circuit is completed. That is, unnecessary wait time can be reduced, and the total processing time, that is, the time from the start of the reconfiguration to the completion of the operation can be reduced.

Modification Example 2

In the above-described first embodiment, the process of the next operation type starts after the completion of the process of the previous operation type. However, when the areas of the logic circuit to be reconfigured do not overlap each other, the reconfiguration and the error check of the logic circuit of the next operation type may be started without waiting for the completion of the process of the previous operation type.

Timing Chart

FIG. 13 is a timing chart illustrating an operation of the autonomous traveling control device 2 according to the modification example. In FIG. 13, time t0 to t4 and t10 are the same as illustrated in FIG. 11 of the first embodiment. In addition, the operations at time t0 to t3 are the same as illustrated in FIG. 11. In the modification example, at time t3, the process controller 202 instructs the second operation A circuit 207A-2 to start the process and notifies the reconfiguration instruction including the circuit data of the first operation B circuit to the reconfiguration controller 204. In addition, the reconfiguration of the first operation B circuit 207B-1 is started by the reconfiguration controller 204. That is, the reconfiguration of the first operation B circuit 207B-1 that starts at time t4 in the first embodiment is advanced to time t3. Here, the reason why the execution of the second operation A circuit 207A-2 and the reconfiguration of the first operation B circuit 207B-1 can be executed simultaneously is that the areas thereof do not overlap each other.

During the operation of the autonomous traveling control device 2 after time t4, the time after time t4 in the first embodiment is advanced by (t4-t3), that is, is shifted to the earlier time. Therefore, the output of the control command is completed at time t10 in the first embodiment but is completed at the time that is earlier than time t10 by (t4-t3) in the modification example.

Operation of Process Controller 202

FIG. 14 is a flowchart illustrating an operation of the process controller 202 according to the modification example. FIG. 14 mainly illustrates different points from those of FIG. 9 in the first embodiment and does not illustrate the same processes. In addition, in the following description, the same processes as those of the first embodiment will not be repeated.

In Step S850 that is executed after Step S804, the process controller 202 determines whether or not the area of the circuit in which the operation is being executed and the area of the circuit that is subsequently reconfigured overlap each other. Each of the circuit data stored in the circuit DB 5 also includes information regarding the size of the circuit to be reconfigured. Therefore, the process controller 202 can specify the area configured by each of the circuits by referring to all the circuit data used in the same operation type. When the process controller 202 determines that the areas overlap each other, the process controller 202 remains in Step S850 and waits for the completion of the operation that is being executed. When the process controller 202 determines that the areas do not overlap each other, the process controller 202 proceeds to Step S805. When the circuit in which the operation is being executed is not present, for example, when the first process is executed in Step S850, the process controller 202 determines NO in this step. The processes after Step S805 are the same as those of the first embodiment. However, when the process controller 202 determines YES in Step S809, the process controller 202 proceeds to Step S812 without executing Step S811. That is, in the first embodiment, the process controller 202 waits until the operation result is obtained in Step S811. However, the process controller 202 proceeds to Step S812 without waiting.

Therefore, when the process controller 202 instructs the second operation A circuit 207A-2 to start the operation process at time t3 (S808) as illustrated in FIG. 13, the process controller 202 determines YES in Step S809, proceeds to S812, determines NO in S812, and returns to Step S803 through Step S813. Since the process controller 202 determines NO in Step S850, the reconfiguration of the first operation B circuit 207B-1 is started in Step S805. The processes of Step S809 to Step S850 are instantly executed. Therefore, the timing chart in FIG. 13 illustrates that the start of the operation process of the second operation A circuit 207A-2 and the start of the reconfiguration of the first operation B circuit 207B-1 are simultaneously executed.

In this configuration, the time required for the preparation of the arithmetic circuits of different operation types can be covered up, and such that the duration required until all the operations by the logic circuit 255 are completed from the start of the reconfiguration of the logic circuit 255 can be reduced.

Modification Example 3

In the above-described first embodiment, the process controller 202 transmits the second reconfiguration command after the reconfiguration of the first circuit is completed. However, the process controller 202 may transmit the second reconfiguration command until the execution of a predetermined process of the first circuit is completed after the completion of the check of the first circuit. For example, in FIG. 11, the reconfiguration command of the second operation A circuit 207A-2 may be transmitted between time t2 and time t3.

Other Modifications

The above-described first embodiment may be further modified as follows.

(1) The reconfiguration controller 204 does not necessarily include the circuit data cache unit 44. In this case, when the error monitoring unit 43 detects an error, the process controller 202 transmits the circuit data to the reconfiguration circuit 203 again.

(2) A part or the entirety of reconfiguration controller 204 may be configured outside the reconfiguration circuit 203.

Second Embodiment

Hereinafter, a second embodiment of an autonomous traveling control device that is an electronic control device will be described with reference to FIG. 15. In the following description, the same components as those of the first embodiment are represented by the same reference numerals, and differences will be mainly described. Points that are not particularly described are the same as those of the first embodiment. The second embodiment is different from the first embodiment in that the logic circuit can simultaneously execute the reconfiguration and the error check of the arithmetic circuit.

System Configuration

The configuration of the autonomous traveling control device according to the second embodiment is the same as that of the first embodiment. However, a program that is stored in the ROM 252 of the autonomous traveling control device 2 is different from that of the first embodiment, and an operation of the process controller 202 is different from that of the first embodiment. In addition, in the embodiment, the adjustment unit 41 of the reconfiguration controller 204 notifies the notification to the process controller 202 even when the reconfiguration of the arithmetic circuit by the configure unit 42 is completed. When the notification that the reconfiguration of the arithmetic circuit is completed is received from the reconfiguration controller 204, the process controller 202 transmits the reconfiguration command to the reconfiguration controller 204 to start the reconfiguration of the next arithmetic circuit.

Timing Chart

FIG. 15 is a timing chart illustrating an operation of the autonomous traveling control device 2 according to the second embodiment. In FIG. 15, time t0 to t5, t7, and t8 are the same as illustrated in FIG. 11 of the first embodiment. The reconfiguration of the first operation A circuit 207A-1 is started at time t1 and is completed at time t31. The process controller 202 that receives the completion notification starts the reconfiguration of the second operation A circuit 207A-2. The error check of the second operation A circuit 207A-2 is completed at time t32 that is earlier than time t3, but the operation of the first operation A circuit 207A-1 is not completed. Therefore, the operation of the second operation A circuit 207A-2 cannot be started yet. Therefore, as in the first embodiment, the process controller 202 waits for the completion of the operation of the first operation A circuit 207A-1 at time t3 and then starts the operation of the second operation A circuit 207A-2. At time t4, the operation of the second operation A circuit 207A-2 is completed. Therefore, the reconfiguration of the first operation B circuit 207B-1 is started.

At time t33 when the reconfiguration of the first operation B circuit 207B-1 is completed, the reconfiguration of the second operation B circuit 207B-2 is started. Concurrently, at time t5 when the reconfiguration of the second operation B circuit 207B-2 is completed, the reconfiguration of the third operation B circuit 207B-3 is started. The error check of the second operation B circuit 207B-2 is completed at t34, but the operation of the first operation B circuit 207B-1 is not completed. Therefore, the process controller 202 waits for the completion of the operation of the second operation B circuit 207B-1. The second operation B circuit 207B-2 starts the operation at time t7 as in the first embodiment. The error check of the third operation B circuit 207B-3 is completed at time t8 in the first embodiment. However, in the embodiment, the error check is completed before the completion of the operation of the second operation B circuit 207B-2. Therefore, the third operation B circuit 207B-3 starts the operation at time t35 that is earlier than time t8.

The operation start time of the third operation B circuit 207B-3 is earlier than that of the first embodiment. Therefore, time t36 that is the operation completion time of the third operation B circuit 207B-3 is also earlier than time t9 that is the operation completion time of the third operation B circuit 207B-3 in the first embodiment. That is, one period of time Ta of t0 to t37 including the control command that is executed after the completion of the operation of the third operation B circuit 207B-3 is shorter than that of the first embodiment.

According to the above-described second embodiment, the following effects can be obtained.

(8) The process controller 202 transmits the second reconfiguration command after the reconfiguration of the first circuit is completed. Therefore, when a FPGA capable of simultaneously executing the reconfiguration and the error check is used, the processing time of the logic circuit can be further reduced.

Modification Examples of Second Embodiment

In the above-described second embodiment, the process controller 202 transmits the second reconfiguration command after the reconfiguration of the first circuit is completed. However, the process controller 202 may transmit the second reconfiguration command until the check of the first circuit is completed after the completion of the reconfiguration of the first circuit. For example, in FIG. 15, the reconfiguration command of the second operation A circuit 207A-2 may be transmitted between time t31 and time t2.

The present invention is not limited to the embodiment and includes various modification examples and identical configurations within the scope of the appended claims. For example, the embodiments have been described in detail in order to easily describe the present invention, and the present invention is not necessarily to include all the configurations described above. In addition, the drawings illustrate control lines or information lines as considered necessary for explanations but do not illustrate all control lines or information lines required on the actual production line. It can be considered that almost of all components are actually interconnected.

The program is stored in the ROM 251. However, the program may be stored in the flash memory 254. In addition, the autonomous traveling control device 2 may include an input/output interface (not illustrated) such that a program is read from another device as necessary via a medium that is usable by the input/output interface and the autonomous traveling control device 2. Here, the medium refers to, for example, a storage medium that is attachable and detachable to and from the input/output interface, a communication medium, that is, a wired network, a wireless network, an optical network, or the like, or a carrier wave or a digital signal that propagates through the network. In addition, a part or all of functions that is implemented by the program may be implemented with a hardware circuit or a FPGA.

The embodiments and the modification examples described above may be combined with each other. Various embodiments and modification examples have been described above, but the present invention is not limited to the details thereof. Other aspects conceivable within the technical scope of the present invention are also included in the range of the present invention.

The entire content of the disclosure of the following priority application is incorporated herein by reference.

REFERENCE SIGNS LIST

2: autonomous traveling control device
3: process information database
4: circuit management database
5: circuit database
202: process controller
203: reconfiguration circuit
204: reconfiguration controller
206: arithmetic unit
207: arithmetic circuit
255: logic circuit
41: adjustment unit
42: configure unit
43: error monitoring unit
44: circuit data cache unit

The invention claimed is:

1. An electronic control device comprising:
a logic circuit capable of reconfiguring a plurality of arithmetic circuits including a first circuit and a second circuit;
a reconfiguration controller that reconfigures the arithmetic circuits and checks the reconfigured arithmetic circuits based on reconfiguration commands; and
a process controller that transmits the reconfiguration commands to the reconfiguration controller and instructs the arithmetic circuits to execute operations,
wherein when a first reconfiguration command is received, the reconfiguration controller reconfigures and checks the first circuit,
when the check of the first circuit by the reconfiguration controller is completed, the process controller instructs the first circuit to execute an operation,
the process controller transmits a second reconfiguration command to the reconfiguration controller and instructs the reconfiguration controller to start to reconfigure the second circuit until the operation of the first circuit is completed after completion of the reconfiguration of the first circuit.

2. The electronic control device according to claim 1, wherein the process controller transmits the second reconfiguration command to the reconfiguration controller until the check of the first circuit is completed after completion of the reconfiguration of the first circuit.

3. The electronic control device according to claim 1, wherein the process controller transmits the second reconfiguration command to the reconfiguration controller until the operation of the first circuit is completed after completion of the check of the first circuit.

4. The electronic control device according to claim 1, wherein the reconfiguration controller checks the second circuit after completion of the reconfiguration of the second circuit, and
the process controller instructs the second circuit to execute an operation using a result of the operation of the first circuit after the check of the second circuit and the operation of the first circuit are completed.

5. The electronic control device according to claim 1, wherein the reconfiguration controller restarts to reconfigure the arithmetic circuits when an error is detected during the check of the arithmetic circuits.

6. The electronic control device according to claim 1, wherein the number and a scale of each of the arithmetic circuits reconfigured in the logic circuit is determined based on an execution time of operation that is executed in the arithmetic circuit.

7. The electronic control device according to claim 1, further comprising a circuit management database that stores information regarding the plurality of arithmetic circuits configured in the logic circuit,
wherein the process controller outputs the reconfiguration commands to the reconfiguration controller based on the circuit management database.

8. The electronic control device according to claim 1, wherein the reconfiguration controller includes a configure unit that reconfigures the arithmetic circuits and a monitoring unit that checks the reconfigured arithmetic circuits,
the configure unit starts to reconfigure the arithmetic circuits after receiving the reconfiguration commands from the process controller, and
after the reconfiguration by the configure unit is completed, the monitoring unit starts to check the reconfigured arithmetic circuits and notifies a result of the check to the process controller.

9. The electronic control device according to claim 1, wherein when an area where the first circuit is configured and an area where the second circuit is configured do not overlap each other, the process controller transmits the second reconfiguration command to the reconfiguration controller and instructs the reconfiguration controller to start to reconfigure the second circuit until the operation of the first circuit is completed after completion of the reconfiguration of the first circuit.

10. A circuit reconfiguration method that is executed in a logic circuit in which a plurality of arithmetic circuits including a first circuit and a second circuit are reconfigurable, the circuit reconfiguration method comprising:
reconfiguring and checking the first circuit;
instructing the first circuit to execute an operation after the check of the first circuit is completed; and
starting to reconfigure the second circuit until the operation of the first circuit is completed after completion of the reconfiguration of the first circuit.

* * * * *